(12) United States Patent
Swift et al.

(10) Patent No.: US 8,673,416 B2
(45) Date of Patent: Mar. 18, 2014

(54) MULTILAYER ELECTRICAL COMPONENT, COATING COMPOSITION, AND METHOD OF MAKING ELECTRICAL COMPONENT

(75) Inventors: Joseph A. Swift, Ontario, NY (US); Stanley J. Wallace, Victor, NY (US); Roger Bullock, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 932 days.

(21) Appl. No.: 12/607,559

(22) Filed: Oct. 28, 2009

(65) Prior Publication Data

US 2011/0094777 A1 Apr. 28, 2011

(51) Int. Cl.
*B32B 1/08* (2006.01)
*G01R 1/067* (2006.01)

(52) U.S. Cl.
CPC .................. *G01R 1/06711* (2013.01)
USPC ..... 428/36.4; 428/34.1; 428/35.7; 174/126.1; 174/126.2; 174/128.1; 174/128.2; 174/131 B; 324/755.01; 324/755.11

(58) Field of Classification Search
USPC .......... 428/36.3, 36.4, 34.1, 34.4–34.7, 35.7; 73/866.5; 343/703; 324/755.01–755.11; 174/126.1–128.2, 174/130, 131 R, 131 A, 131 B
See application file for complete search history.

(56) References Cited

U.S. PATENT DOCUMENTS

| | | | | |
|---|---|---|---|---|
| 3,839,072 A | 10/1974 | Kearsey | | 427/172 |
| 5,643,990 A | 7/1997 | Uehara et al. | | 524/496 |
| 6,426,134 B1 | 7/2002 | Lavin et al. | | 428/300.1 |
| 6,599,961 B1 | 7/2003 | Pienkowski et al. | | 523/120 |
| 7,060,241 B2 | 6/2006 | Glatkowski | | |
| 7,265,174 B2 | 9/2007 | Carroll et al. | | 524/495 |
| 7,282,260 B2 | 10/2007 | LeGrande et al. | | 428/323 |
| 7,378,040 B2 | 5/2008 | Luo et al. | | 252/500 |
| 7,393,472 B2 | 7/2008 | Lee et al. | | 252/500 |
| 7,402,264 B2 | 7/2008 | Ounaies et al. | | 252/511 |
| 7,413,474 B2 | 8/2008 | Liu et al. | | 439/579 |
| 7,422,708 B2 | 9/2008 | Kunze et al. | | 252/521.3 |
| 7,442,284 B2 | 10/2008 | Ren et al. | | 205/159 |
| 2003/0089893 A1 | 5/2003 | Niu et al. | | 252/500 |
| 2003/0158323 A1 | 8/2003 | Connell et al. | | 524/495 |
| 2004/0071949 A1* | 4/2004 | Glatkowski et al. | | 428/313.3 |
| 2006/0057361 A1 | 3/2006 | Ounaies et al. | | 428/323 |
| 2006/0057377 A1 | 3/2006 | Harrison et al. | | 428/364 |
| 2007/0012900 A1 | 1/2007 | Callen et al. | | 252/500 |

(Continued)

OTHER PUBLICATIONS

Fangming Du et al., "Effect of nanotube alignment on percolation conductivity in carbon nanotube/polymer composites", Physical Review B 72, 121404(R) (2005), (4 pp.).

*Primary Examiner* — Callie Shosho
*Assistant Examiner* — Nicholas Kokkinos
(74) *Attorney, Agent, or Firm* — Alix, Yale & Ristas, LLP (57) ABSTRACT

Disclosed herein is an electrical component including a substrate comprising an electroconductive filler in a first polymeric binder, and a coating layer adhered to at least a portion of the substrate surface, the coating layer comprising a nanostructured electroconductive particulate dispersed in a polymeric binder, such as an epoxy resin. A method of making the component also is disclosed, comprising obtaining a substrate containing an electroconductive filler in a polymeric binder, dispersing a nanostructured electroconductive particulate filler in a liquid that includes a solvent and/or a reactive diluent to form a dispersion, mixing the dispersion with a liquid resin to form a coating mixture, applying the coating mixture to the substrate, and crosslinking the applied coating mixture to form the coated substrate.

23 Claims, 3 Drawing Sheets

(56) References Cited

U.S. PATENT DOCUMENTS

| | | | |
|---|---|---|---|
| 2007/0065651 A1* | 3/2007 | Glatkowski et al. ....... 428/297.4 |
| 2008/0195187 A1 | 8/2008 | Li et al. ..................... 607/116 |
| 2008/0265217 A1 | 10/2008 | Horton ........................ 252/503 |
| 2008/0287589 A1 | 11/2008 | Ounaies et al. ............... 524/495 |

* cited by examiner

MULTILAYER ELECTRICAL COMPONENT, COATING COMPOSITION, AND METHOD OF MAKING ELECTRICAL COMPONENT

BACKGROUND

The embodiments disclosed herein relate to electrical components, and to a method of making such components.

Automated testing of integrated circuit components as well as other active and passive circuit members including circuit boards is often conducted using a contact probe to temporarily connect the device under test (DUT) to a test instrument. A signal is communicated by the contact probe through a suitable interconnection, which may include electric cables, hook up wires, connectors, and the like to the instrument which can process and/or display details of interest relating to the signal(s) of interest. The instrument may be any applicable test instrument which may include a voltmeter, an ammeter, an ohm meter, a multimeter, an oscilloscope, and the like. The signal of interest stemming from the DUT may originate from operation of the device under actual use conditions, under simulation or stress conditions, or under a burn-in test protocol. Alternately, the instrument or related circuitry may provide a reference signal or power to the DUT while simultaneously extracting a sample return signal for characterization or display. Often, more than one probe is used to simultaneously monitor more than one signal and/or more than one location. The number of probes can be in the range of 10 to 100 or more. In this case, individual probes may be arranged into an array of probes, which may be known by such terms as a bed-of-nails.

Characteristic of the probes in widespread contemporary use are probe elements having contact tips that are made primarily of metal. The disadvantage of using metal-tipped probes is that under certain conditions the typical metal-to-metal contact between the probe and circuit member potentially can introduce an undesired electric bias or even a surge into the measurement, particularly in AC measurements owing to a capacitance and/or inductance the metal tip induces into the test circuit. In this case, inaccurate results are produced. Other disadvantages to the use of metal tip probes include mechanical damage to the probe or to the circuit member such as scratching, denting, piercing, and even welding under high current conditions, contamination of the DUT due to transfer of metal surface oxides, and the like. A further disadvantage to metal probes used in large arrays is that they are generally heavy and require costly support structures to maintain positional precision.

Electric probes are also used in the medical industry and in the medical research field as temporary contacts to a wide range of materials and surfaces. These include such materials as human or animal skin, internal organs of the same, cells and groupings of cells, and the like. Often these probes are made from non-metal conductive materials such as inorganic salts in a suitable adhesive or gel medium which can adhesively join to and thereby serve to interconnect the surface of interest to a test instrument, such as an electrocardiogram monitor, a skin conductivity tester, and the like. The disadvantage to these non-metallic probes is that an adverse chemical reaction or allergic reaction may occur between the test subject and the contacting probe.

Certain electrical components used in electrostatographic printing machines are manufactured from composites, including composite plastics, that contain at least one filler which can be in the form of fine particles or fibers. The composites may be formed from a non-metallic pultruded composite member having multiple, generally circular cross section carbon fibers in a polymer matrix.

Various documents describe polymer composites containing carbon particles. U.S. Pat. No. 6,426,134 discloses single wall carbon nanotube-polymer compositions. U.S. Pat. No. 5,643,990 describes a variety of resins containing carbon fibrils.

It is known to use conductive nanoparticles in coatings. U.S. Published Patent Application No. 2008/0195187 describes a medical electrical lead having a conductor assembly covered by an insulating layer, and a shield covering formed from a polymer-matrix composite containing one or more nanosized metal structures, U.S. Published Patent Application No. 2003/0158323 describes an electrically conductive, optically transparent polymer/carbon nanotube composite. The composite is formed by dispersing the nanoparticles in an organic solvent and subsequent addition of one or more monomers. Alternately, the sequence may be reversed such that the monomer or polymer is dispersed in a solvent or diluent and the nanoparticles are subsequently added and dispersed therein.

It would be useful to develop new compositions, electrical components and processes for making compositions and electrical components that are useful in ultra-high frequency digital sensing and probing applications.

SUMMARY

One embodiment is an electrical component including a substrate comprising an electroconductive filler in a polymeric binder, and a coating layer adhered to at least a portion of the substrate surface, the coating layer comprising a nanostructured electroconductive particulate filler and a polymeric resin. In embodiments, the filler is substantially uniformly dispersed in the resin.

Another embodiment is an electrical component including a substrate comprising an electroconductive filler in a first polymeric binder, and a coating layer adhered to at least a portion of the substrate surface, the coating layer comprising a nanostructured electroconductive particulate filler substantially uniformly dispersed in a second polymeric binder, the adhesive strength between the coating layer and the substrate being at least 10% of the cohesive strength of the substrate. In embodiments, the adhesion between coating layer and substrate may be equivalent to, or nearly equivalent to, the cohesive strength of the substrate layer and in other embodiments the adhesion between layers is sufficient such that the coating does not debond or delaminate from the substrate under the entire range of forces exerted thereon during the use of the component in the intended application.

Yet another embodiment is method including obtaining a substrate comprising an electroconductive filler in a polymeric binder, dispersing a nanostructured electroconductive particulate filler in a liquid comprising at least one of a solvent and a reactive diluent to form a dispersion, mixing the dispersion with a liquid resin to form a coating mixture, applying the coating mixture to the substrate, and crosslinking the applied coating mixture to form a coated substrate.

A further embodiment is method including obtaining a substrate comprising an electroconductive filler in a polymeric binder, dispersing a nanostructured electroconductive particulate filler in a diluent or solvent to form a dispersion, mixing the dispersion with a liquid resin to form a coating mixture, applying the coating mixture to the substrate, and crosslinking the applied coating mixture to form a coating layer on the substrate. In embodiments, the adhesive strength between the coating layer and the substrate is at least 10% of the cohesive strength of the substrate.

DETAILED DESCRIPTION

An electrical component, coating composition, and related method are provided involving the use of composite materials that are effectively integrated using a series of low cost production methods to provide electrical components with a unique combination of performance characteristics. Use of the method described herein enables the economical production of components that are consistent in quality and have a high level of precision in their electrical and mechanical properties. The method of making the composite substrates is useful for producing electroconductive layers of varying thicknesses on components of various sizes, including relatively thick conductive layers intended to improve durability of an article, as well as thin-film layers for components that are small and are engineered to very precise specifications. In contrast to metal plating methods that treat the surface of the polymeric substrate, the method described herein incorporates electroconductive nanoparticles into the coating solution. The component and production method can be used in making contact elements, connectors, contacts, arrays of contacts, interconnects and the like for use in for example signal transmission, sensing, or switching connectors, as well as for medical and electronic test instrument probes including instruments for testing of high-speed, mixed signal IC circuit applications, and for other applications in which electric components are required to meet very precise electrical resistance and dimensional specifications.

As used herein, "electrical component" is a component or member that allows for passage of electrical current, charge, or voltage. Electrical components include but are not limited to electronic and electrostatic components. The term "resistance" as used herein refers to electrical resistance unless otherwise specifically indicated. The term "binder" or "binder resin" as used herein refers to a matrix material that retains the filler in place and may provide for one or more mechanical or structural features of the substrate, coating or component. An "electrical contact" as used herein refers to a resistive electrical component that permits current flow between conducting parts to be controlled within a target region, including but not limited to contacts used in signal transmission, sensing probes and other analog, high frequency, or digital electrical connections. "Resistive electrical contact" as used herein refers to an electrical contact having a specific and carefully controlled electrical conductivity.

As used herein, the term "composite" refers to a polymer combined with at least one filler. The filler concentration in the resin may be at a loading of 0.1 parts per hundred by weight (which is also referred to throughout this document as percent by weight and weight percent) or more. A "substantially homogeneous composition" as used herein is one in which all of the constituents are essentially uniformly dispersed in the material. A "filler" as used herein is a material or mix of materials such as particles, spires, shards, platelets, tubes, fibrils, fibers, or filaments that can have any appropriate dimension(s) and can be combined with the polymer, which is also referred to as a resin or binder resin, to form a composite. The fillers do not dissolve in the solvents that are used. In many cases, the fillers do not copolymerize with the polymer. The term "functionalized filler" refers to a filler material as described above that may react or copolymerize with the elements of the composite. As used herein, a "polymeric material" is a polymer, monomer, or polymeric precursor that forms a polymer upon curing and/or evaporation of a solvent or diluent. In some cases, the polymeric material will be present in a liquid when it is obtained and a separate liquid will therefore not always need to be added. In some cases the polymer when in its final form may be a rigid solid, a semi-rigid solid, a flexible solid such as a rubber or an elastomer, or a foam.

As used in this document the terms fiber and filament are intended to indicate metal, polymer, glass, and ceramic thread-like structures which include synthetic, polymer-based, thread-like, monofilamentary structures including composite fibers such as carbon-filled polymers and natural fiber such as silk or cotton thread-like structures. A "filament" as used herein is a substantially continuous fiber.

When a "low contact resistance" component is being made for use in an instrument probe, the coating layer(s) on the substrate serves as the point(s) of contact between the probe and device under test. Devices of this type typically are formed from rods having very small cross sectional diameters and may have a tapered diameter or other shape to form at least one point-shaped end (not shown). Thus the total quantity of coating material on the end of the rod may be very small. Probes, or electric components in general, of this type may be referred to as "miniature-" or micro-miniature" devices.

In order to make ultra-high performance electrical contacts, manufacturing methods are needed that provide for very tight tolerances, particularly for narrow specification ranges of properties such as electrical resistance. Obviously, this requires that very tight tolerances and generally narrow specification ranges are under control for key properties such as electrical resistance. In general, the subject components are small in size and must be of sufficient strength to meet the requirements of the intended application. For certain end uses, an electrical contact requires a resistance with a tolerance of +/−0.5% or less. However, the commercial norm for resistance tolerances of non-metallic contacts is about +/−100 to 1000% for commercially available electrical contacts.

The electrical component described herein comprises a substrate having a plurality of aligned fibers and a binder. The substrate is manufactured by obtaining a segment of fibrous component material retained within a suitable binder material to form a structurally solid, rigid, or semi-rigid structural element, overcutting the element to a length slightly longer than the desired final length, assembling the fibrous component material into the shape of an electrical component, measuring the resistance of the component, and trimming the component to obtain the desired resistance value using a precise cutting technique. An electroconductive coating is then applied to a portion of the component.

Figure 1:
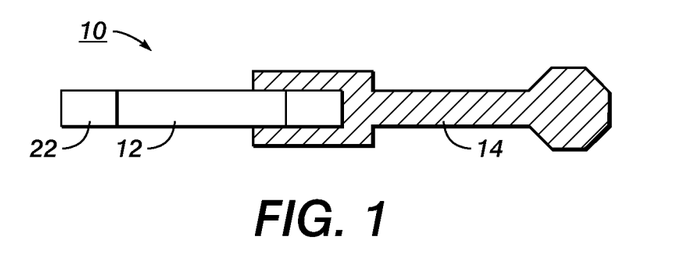
FIG. 1 schematically shows an electrical component according to one embodiment.
Figure 2:
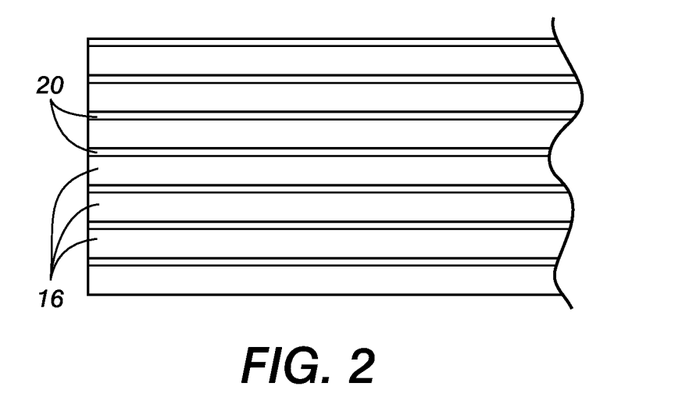
FIG. 2 schematically shows further detail of the construction of the electrical component shown in FIG. 1.

Referring to FIGS. 1 and 2, one type of composite component, an electrical component, is shown and is generally designated as 10. The component includes a fiber-filled composite polymeric round shaped rod-member 12 in a mounting 14, which is shown in cross section. A coating layer 22 or thin film is formed on at least one end of the rod 12. The rod 12 contains a plurality of aligned filler fibers 16, shown in FIG. 2 (without the coating layer 22), held together by a binder 20.

Figure 3:
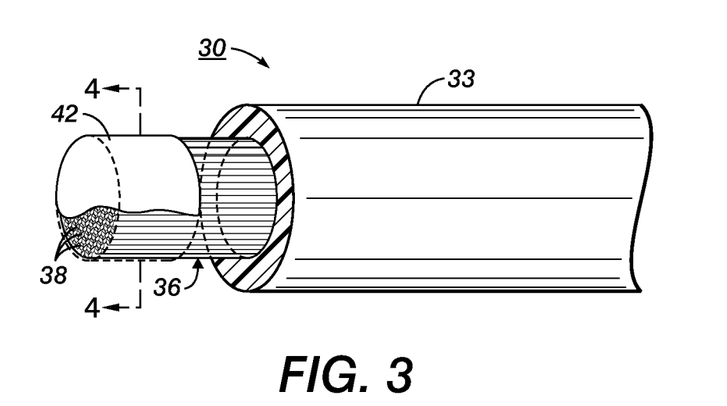
FIG. 3 shows a coated component according to another embodiment, partially cut away.

FIG. 3 shows another embodiment of an electrical component, generally designated as 30. The component has a core 36 formed from binder and fibers, similar to the construction shown in FIG. 2. A sleeve layer 33 surrounds the core 36 over at least a portion of its length. A portion of the sleeve layer has been removed in order to expose the terminal end 38 of the core 36. The sleeve layer resistance may be lower than the resistance of the fibrous core material or may be greater than the fibrous core depending upon the specific material compositions of the two layers. Use of the dual layer component enables very precise control of the series-circuit resistance or in other words, the aggregate electrical resistance that may be measured from one point on the terminal end to the other end of the component 30 or from one end to a point on the side. This control is accomplished by cutting away a specific quantity of the sleeve layer 33 and controlling the length of the core 36 that extends between the sleeve 33 and terminal end 38. A coating layer 42 (shown in FIG. 3 as partially cut away to reveal the ends of the core 36) is adhered to the terminal end 38 of the core 36 and an adjacent portion of the outer surface of the core 36.

Figure 4:
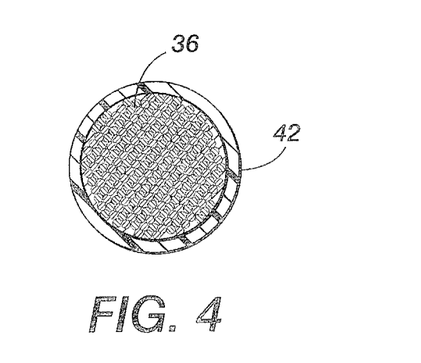
FIG. 4 is a sectional view of the core portion of the coated component of FIG. 3.

FIG. 4 shows a cross-sectional view of the outer end of the core 36. The coating layer 42 has a generally uniform composition throughout its thickness. In some cases the coating is applied in a single step while in other cases multiple thin layers of the same material are successively applied.

Figure 5:
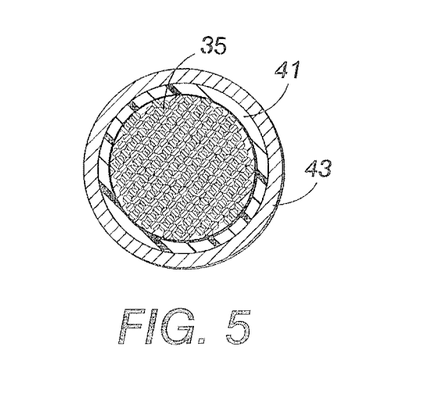
FIG. 5 is a sectional view of a core portion of a coated component having a multi-layer coating formed thereon.

FIG. 5 shows an embodiment of a core 35 with an outer end having two different types of coatings applied successively thereon. The inner coating layer 41 has a first composition and the outer coating layer 43 has a second composition. This type of configuration can be useful in order to promote adhesion and/or strength of the assembly, obtain a certain desired set or unique combination of electrical and/or mechanical properties, build thicker shell layers, facilitate automation or simplification of the manufacturing process, facilitate achievement of consistent quality, and the like.

The electrical components shown in FIGS. 1-5 can be designed to have a wide range of tightly controlled electrical, mechanical, dimensional, and physical properties. The type and quantity of the resin(s) and filler(s) in the substrate and coating can be selected to result in the desired properties because, for example, good adhesion usually hinges upon achieving specific interface conditions at the junction between the coating layer and substrate, which in turn hinges upon such factors as interface cleanliness, compatibility of the resins and solvent(s), surface energy and surface tension of the coating 42 and substrate 36, and the like. These desired interface conditions can be obtained for a wide range of fillers, filler quantities, blends of fillers, and polymer types.

The polymeric portion of the substrate can be a thermoset or thermoplastic polymer. Suitable thermoset and/or thermoplastic polymers for use in making the component include, but are not limited, to epoxies, acetals, ionic and non-ionic polyurethanes, polyimides, polyesters, silicones, synthetic and natural rubbers (ionic and non-ionic), polyether sulfones, polysulphones, polybutylphthalates, polyether ether ketones, polyether imides, polystyrenes, polyolefins, polyethylene terephthalates (PETs), polyamides, polyvinyl chlorides, polyphenylene oxides, polycarbonates, ABS, fluoropolymers, and blends and copolymers containing the above-listed polymers. As indicated above, the polymer, monomer, or pre-polymer thereof must be either a liquid and/or dispersible in a liquid solvent and/or diluent and solidify upon drying, cooling, and/or cross-linking. The polymer is present in an amount of about 0.1 to about 99 parts by weight, or about 1 to about 75 parts by weight, or about 2 to about 20 parts by weight based upon 100 parts by weight of the polymer and filler.

When the polymer is a thermoset, it is crosslinked using a suitable crosslinking agent, such as a substance that induces crosslinking upon the application of heat, pressure, or radiation, or a combination of these. A crosslinking agent can be used in an amount of, for example, about 0.1 to about 10, or about 0.5 to about 2 parts per hundred (pph) by weight based upon the weight of the polymer.

The filler for the substrate can be fibers or filaments, including carbon fibers, carbon filaments, carbon nanotubes, carbon nanofibers, carbon nanofilaments, or fiberglass or metal coated fibers such as metallized carbon fibers or metallized fiberglass, as well as polymeric types, either synthetic or natural fibers or filaments such as nylon, polyester, silk, and the like. Metallized polymeric fibers may be used. Blends of fillers may be used. Additional non-limiting examples of substrate filler fibers and filaments to be used are carbon black, ionic salts including quaternary ammonium compounds, boron nitride, and short lengths of conductive carbon fibers. In many cases the fibers are required to have high tensile and bending strengths. One suitable fiber comprises a plurality of carbon fibers in a polymer matrix and is known as CarbonConX™ (Xerox Corp.). Low pressure pultrusion is one exemplary process that may be used to bundle large numbers of carbon fibers, for example thousands of fibers, ensuring redundancy in the contact point within a suitable binder resin. This process often involves pulling the carbon fibers and a thermoplastic or thermosetting polymer through a shaping and curing or solidification die. The components are characterized by high density of evenly distributed conduction sites, high immunity to the formation of non-conductive films, and high contact integrity in contact degrading environments. Selection of a filler for the substrate and coating will depend in part upon the desired electrical resistance and the requirements of the intended application.

For one type of fiber filler for the substrate, for example, the precursor fiber is a polyacrylonitrile (PAN) and it is treated by controlled temperature carbonization. The details of this process are provided in commonly assigned U.S. Pat. No. 4,553, 191, the contents of which are incorporated herein by reference in their entirety.

In some embodiments, the filler is present in the composite in an amount of at least 1.0, and usually is present in about 1 to about 99.9 parts by weight, or about 25 to about 99 parts by weight, or about 80 to about 98 parts by weight based upon 100 parts by weight of the polymer and filler. The methods described herein are particularly useful for making filled polymeric components for which metal plating will not adhere if conventional plating techniques are used. Different fillers and even different polymers can be combined and used together in a single substrate.

The liquid in which the polymer and filler are dispersed typically is a solvent and in some cases may be a diluent or a mixture or combination thereof. Generally stated, a "diluent" is a diluting agent that allows a liquid polymer to become thinner, less concentrated, and/or less viscous. A "functional diluent" as used herein is a diluent which has at least one chemically reactive (or functional) moiety that has been added to the molecular chain whereby crosslinking can occur between the diluent molecule(s) and the molecules of a polymer. A solvent is a fluid in which a solid can be at least partially dissolved.

When the component has an overlying sleeve, as in the embodiment shown in FIG. 3, the sleeve layer can be any non-metallic material capable of being deposited over and adhered to the core layer to provide the desired final resistance value. Non-limiting examples of suitable coating materials include Aquadag®, and the carbon or graphite pigmented composite coatings known as "DAGs"®, including but not limited to DAG® 305, DAG® EB-30, and DAG® T-502, Electrodag® 154 Resistance Coating, Electrodag® 402A, 403A, and 404A, Baytron® Antistatic coatings CPP301D, CPP 105, CPP 4531, and the like. Aquadag, Electrodag, and DAG are trademarked products supplied by Acheson Colloid, Port Huron, Mich. Baytron is a registered trademarked product produced by H. C. Starck, GmbH & Co KG (Germany).

The coating layer or layers deposited on at least a portion of the surface of the substrate are typically functionally different than, but functionally synergistic to, the substrate layer. For example, in general the surface of the substrate may not have the desired surface properties required for the intended application such as smoothness, hardness, softness, gloss, wear or impact resistance, chemical resistance or corrosion resistance and the like. Further, the electrical properties of the substrate may not be sufficient to satisfy the requirements of the intended application and may need to be appropriately and/or locally adjusted to fulfill the requirement(s). The properties of the coating layer can be selected to bring these desired properties to the component in a consistent and high quality manner.

The coating comprises a suitable level of at least one nanostructured electroconductive particulate filler dispersed in a suitable polymeric binder. In some cases, the filler is substantially uniformly dispersed in the binder. In one embodiment, the type and level of filler(s) and polymer used in the substrate and coating are selected such that there is either a specific difference between, or there is equivalence, or near equivalence, between the bulk and surface conductivities of the coating layer and substrate as well as a strong mechanical coupling between the coating and substrate. When used to form a probe tip, the coating can be used to replace a conventional and high cost 3-layer copper/nickel/gold tip coating of a conventional probe and provides several important new functions and characteristics. The coating layer 42 may be of any thickness and configuration that fulfills the requirements of the intended application. The thickness may range from less than a micron or even a few angstroms to 3 mm or more. Often the coating has a thickness in the range of the molecular size of the polymer up to 2 mm. As indicated above, the coating may comprise a single layer or multiple layers. Further details of the embodiments including primary and alternate materials and formulation variations are provided below.

Similar to the binder in the substrate, the polymeric binder used in the coating can be a thermoset or thermoplastic polymer. Suitable thermoset and/or thermoplastic polymers for use in making the component include, but are not limited to, epoxies, acetals, ionic and non-ionic polyurethanes, polyimides, polyesters, silicones, synthetic and natural rubbers (ionic and non-ionic), polyether sulfones, polysulphones, polybutylphthalates, polyether ether ketones, polyether imides, polystyrenes, polyolefins, polyethylene terephthalates (PETs), polyamides, polyvinyl chlorides, polyphenylene oxides, polycarbonates, ABS, fluoropolymers, and blends and copolymers thereof. A suitable diluent or solvent is employed to provide for dilution and/or solubility of the polymer, monomer or pre-polymer and viscosity adjustment to enable thin-film coating on the substrate. Non-limiting examples of suitable diluents or solvents include organic aromatic solvents such as toluene, cyclohexane, and benzene, as well as aliphatic organic solvents such as, acetone, methyl isobutyl ketone, methylethylketone, and the like and diluents such as diglycidyl ethers of butanediols (e.g. Heloxy 76, manufactured by Hexion Specialty Chemicals), and polyfunctional glycidyl ether (e.g. Heloxy 67 (difunctional), Heloxy 68 (difunctional) and Heloxy 76 (trifunctional)). As indicated above, the polymer, monomer, or pre-polymer thereof must be dispersible in a liquid and solidify upon drying, cooling, and/or cross-linking. The polymer is present in an amount of about 0.5 to 99 parts by weight, or about 5 to about 98 parts by weight, or about 20 to about 90 parts by weight based upon 100 parts by weight of the polymer and filler, which comprise the composition. In general, the polymer selected for the coating layer composition may be the same or different from that used for the substrate composition, but is typically greater in concentration that the concentration employed in the substrate. For example, the concentration of the polymer of the coating may be at least 1.5 to 2 times greater than the concentration used for the substrate composition.

When the coating polymer is a thermoset, it is crosslinked using a suitable crosslinking agent, such as a substance that induces crosslinking, the application of heat, pressure, or radiation, or a combination of these. A crosslinking agent can be used in an amount of, for example, about 0.1 to about 10, or about 0.5 to about 3 parts per hundred (pph) by weight based upon the weight of the polymer.

The nanostructured electroconductive particulate filler used in the coating is a nano-sized material such as carbon nanotubes, which optionally are functionalized, boron nitride nanotubes, and/or nanoparticles of Au, Ag, Sn, Cr, Cu, Ni, Zn, Be, Pt, Pd, Ti, Mo, and/or Mn, metal oxides and the like, or mixtures or blends thereof. Other suitable fillers include nanostructured organic salts, inorganic salts and crushed fibers. The filler typically is used in an amount of about 1 to about 30 wt. %, or about 1.5 to about 25 wt %, or about 2 to about 20 wt. %.

The nanostructured electroconductive particulate filler typically has particles with a size of 1-300 nm and if the filler is in the form of a fiber, its lengths can be in the range of 1-500 μm or more. Non-limiting examples of suitable filler materials include multiwall carbon nanotubes in the shape of fibers or strands having an outer diameter of 7-15 nm, an inner diameter of 3-6 nm, and a length of 3-200 μm, such as those available from Sigma-Aldrich and/or Zyvex, silver nanopowder having an ellipsoidal or spherical shape and a particle size range of 3-100 nm, palladium nanopowder having an ellipsoid or spherical shape and a particle size of 5-100 nm, and diamond nanopowder.

Additional fillers can be added to the coating to impart other desired characteristics, such as strength, scratch or impact resistance, low friction, chemical or contamination resistance, corrosion resistance, smoothness, or softness, gloss, or color. Such fillers include, but are not limited to, nano silica to impart toughness, silicon dioxide to impart hardness and scratch resistance, titanates for example barium titanate to impact electrical characteristics such as dielectric properties fluropolymers or stearates such as zinc stearate to reduce surface friction and contamination and colorants.

In embodiments, the coating adheres to the substrate with an adhesive strength that is at least 10% of the cohesive strength of the substrate, or at least 30% or at least 50%. In embodiments, the surface resistance of the coating layer is generally the same as the bulk resistance of the substrate. In embodiments, the electroconductive filler in the substrate comprises aligned carbon fibers.

Figure 6:
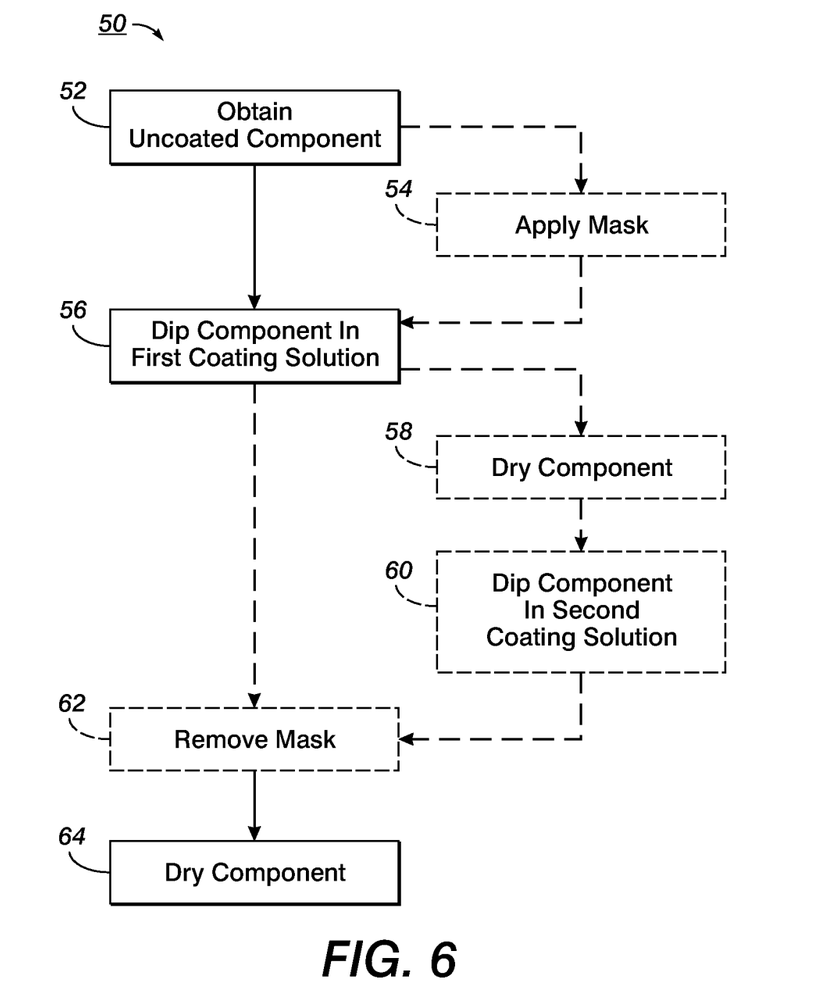
FIG. 6 is a flow chart showing a method of forming a coated composite according to one embodiment.

FIG. 6 shows a method for producing a coated substrate according to one embodiment. The overall method is designated as 50. An uncoated component is obtained at 52 and optionally is partially masked at 54. The component is dipped in a first coating solution at 56. In the case of a multilayer coating, the component is optionally dried at 58 and is then dipped in a second coating solution at 60. The mask is removed (if applicable) at 62 and the component is dried at 64. Alternatively, the mask may be removed after final drying. The method can be used to mass produce components having precise electrical properties, such as resistance. In embodiments, a set of electrical components is produced in which the electrical resistance of each component is within 1% of the resistance of each of the other electrical components in the set. Usually, all of the components in the set have the same composition.

As alternatives to dip coating, the coating can be applied by spray coating, transfer coating, kiss coating, pad coating, roll coating, spin coating, and the like.

The methods described herein can be used in making components having any number of coating layers of any size, including small coating layers having a surface area of about 1 square micron to about 100 mm$^2$. Large-scale production of small components having very precisely controlled mechanical and electrical properties can be achieved.

One useful type of electrical component contains a substrate with a high loading of carbon fibers held together by a thermoset or thermoplastic polymer binder. One particular configuration of a substrate comprises an epoxy resin binder, a crosslinking agent, and a filler comprising carbon fiber. The coating layer is deposited on the composite. In this embodiment, the epoxy resin typically is used in an amount of about 1 to about 90 parts by weight, or about 2 to about 60 parts by weight, or about 2 to about 10 parts by weight based on 100 parts by weight of resin and filler. The carbon fibers are present in an amount of about 1 to about 99 weight percent or about 80 to about 98 weight percent or about 90 to about 98 parts by weight based on 100 parts by weight of resin and filler. For some applications as few as a single fiber may be used as the filler. One non-limiting example of a crosslinking agent to be used with epoxies in an amount of 0.1 to about 2.0 parts by weight based upon 100 parts by weight of resin is a complex heterocyclicamine, Lindax (Lindau Chemicals, Inc, Columbia, S.C.). The electrical resistance and mechanical strength of the resulting components can be precisely tuned to meet the requirements of the intended application. One type of coating deposited on the substrate described in the previous paragraph is formed from single or multiwall carbon nanotubes and an epoxy binder.

A non-limiting, exemplary end use of components having the construction shown in FIG. 1-5 is as electrical or electronic instrument probes, for example an oscilloscope probe tip that may be formed from a composite comprising a high loading (i.e. in the range of >90% by wgt.) of a resistive carbon fiber (r-fiber), a sufficient amount (i.e. in the range of 2 to 10%) of binder resin, and a suitable crosslinking agent (if needed). The composition is then converted into a solid round rod or other desired configuration by a pultrusion process that employs heat and pressure in a continuous process to shape and solidify the configuration during which time the binder resin is crosslinked solidified. The coating is applied to a portion of the rod.

The following Examples are intended to illustrate and not limit the scope herein.

Comparative Example 1

Component Having a Metal Plated Tip

A set of pultruded composite rods was made, with each rod having a length of about 1.27 cm (0.5 inches) and a diameter of 0.254 mm (0.010 inches) to 0.33 mm (0.013 inches). The rods contained high loadings (>90% by wt.) of r-fiber, i.e. 3K tow resistive PAN-based carbon fiber (Hexcel Corp., Stamford, Conn.), held in a low viscosity, liquid resin, Epon 862 (Hexion Specialty Chemicals, Houston, Tex.). Epon 862 is a diglycidyl ether of Bisphenol-F. Crosslinking of the epoxy resin was initiated with a 1-(2 hydroxypropyl imidazole) crosslinking agent, Lindax-1 (Lindau Chemicals, Inc, Columbia, S.C.). The ends and or sides of some of samples were cut and/or milled using an eximer laser (Resonetics, Inc., Nashua, N.H.). The tip surface region of the composite rod sample was gold plated using a conventional electroless plating process. The plated portion of each rod included the end of the rod, which had a diameter of about 0.285 mm (0.011 inches), and a length extending about 0.2 mm along the side of the rod from the end.

A selected set of physical, mechanical and electrical properties was measured and results from early electrical performance and handling tests revealed that the gold tip initially performed reasonably well and appeared to meet expectations. However, as the test continued, the electrical results became noisy and then a significant fall-off in performance was noted. A correlation was made between the fall-off in performance and flaking off of the gold coating from the samples. In other similar tests that were conducted to further substantiate the cause of the performance fall-off, mechanical testing revealed that the adhesion of the gold to this specimen was poor, as was shown by the significant loss of gold coating from the side regions, where the gold coating could be easily removed.

Example 1

Several tip-coated samples were made using a substrate described in Comparative Example 1 but without the gold plated tip. The substrate was formed from epoxy resin (EPON 862) and the same resistive carbon fiber as was used in Comparative Example 1. Crosslinking of the epoxy resin was initiated with a 1-(2 hydroxypropyl imidazole) crosslinking agent, Lindax-1 (Lindau Chemicals, Inc, Columbia, S.C.). However, instead of gold plating, a carbon nanotube-containing coating was deposited at the tip by immersion and rotation in an uncured polymeric epoxy blend. The coating was formed from a composition of 0.4 grams multi-wall carbon nanotubes (MWCNT) (Product No. 694185, Sigma-Aldrich, St Louis, Mo.) which were mechanically and ultrasonically dispersed in 3 grams of a diglycidyl ether of 1,4-butanediol (Heloxy 67) and then blended with 10 grams epoxy resin (EPON 862) and 0.3 grams of crosslinking agent (Lindax-1). According to the literature, Epon 862 has a weight per epoxide of 165-173 g/eq (ASTM D1652), a viscosity at 25 Deg. C. of 25-45 P (ASTM D445), and a density at 25 Deg. C. of 9.8 lb/gal (ASTM D1475, and Heloxy modifier 67 has an epoxide equivalent weight of 123.4-136.6 g/eq, a viscosity at 25 Deg. C. of 10-20 mPa-s, a density of 9.10-9.30 lbs/gal and a flash point (Setaflash) of greater than 200 Deg. F. The literature indicates that the MWCNT that were used have a 95% carbon basis, with an outer diameter of 6-16 nm, an inner diameter of 2-7 nm, and a length of 0.5-200 μm, Several of the substrates were coated with a thin layer of coating material on both a milled tip end and an opposite full diameter rod end. The carbon nanotube-coated substrates were compared with the gold plated substrates. The carbon nanotube-coated substrates were found to have a longer useful life than the gold plated substrates. The gold plated substrates delaminated after as few as a dozen mechanical actuations with a force of 15-40 g. The modified polymeric tips maintained performance after many multiple dozen actuations and the coating only failed with delamination by sharp knife blade removal which also damaged the base rod structure.

Comparative Example 2

Uncoated Substrate

A set of pultruded rod-shaped substrates having an approximate diameter of 0.56 mm (0.022 inches) and a length of 3.3 cm (1.3 inches) were formed from an epoxy resin, Epon 862 (Hexion Specialty Chemicals, Columbus, Ohio) containing a 3K tow resistive PAN-based carbon fiber. Crosslinking of the epoxy was initiated with a 1-(2 hydroxypropyl imidazole) crosslinking agent, Lindax-1 (Lindau Chemicals, Inc, Columbia, S.C.). The cured substrates contained >85 wt % fiber. The resistance of the rods was measured when a voltage of 1V DC was applied. The measured resistance was 800 ohm/cm.

Examples 2-6

A set of rod-shaped substrates was prepared in the same way as those of Comparative Example 2. However, in these Examples both ends of the rods were coated by tip immersion and rotation in uncured polymeric epoxy blends having the formulations shown below on Table 1, followed by drying for 2 hours in a 200 Deg C. oven. In Example 6, the components were pre-blended in a toluene solvent. The coated portion of each rod included the end of the rod and a length extending about 0.2 mm along the side of the rod from the end.

The bulk surface resistance of each coating composition was measured by preparing 1 cm3 coupons of the coating materials and measuring their resistance after immersion in a 70 wt % nitric acid solution for 15 seconds. The results are shown on Table 1.

In order to measure the resistance of each coated rod-shaped substrate, the samples were dipped in a solution containing 70 wt % nitric acid and 30 wt % water for 15 seconds. Resistance values are shown on Table 1.

The following scale was used to rate adhesion of the coating to the substrate:

| Coating Adhesion Rating | Description |
|---|---|
| 1 | Coating easily removed by sliding or collision contact with a hard surface |
| 2 | Coating delaminates or flakes off after 1-2 dozen mechanical compression actuations of 15-40 g force |
| 3 | Coating has good adhesion; 2 dozen mechanical actuations at a probe force of 40 g produced no delamination |

In Examples 2-6 the tip splintered only when the coating was removed with the sharp knife blade of an Exacto knife, demonstrating that adhesion of the coating to the substrate was very strong.

For applications in which it is desirable to match the resistance of the uncoated rod, the best examples are those with a low resistance value, i.e. Examples 3 and 5. However, intermediate and/or high resistance values can be useful when it is desirable to reduce the conductivity of the substrate for component isolation control and/or resistance matching. Thus, selection of a coating will depend in part upon the desired final conductivity of the coated substrate.

Examples 7-8

Rod-shaped substrates were prepared in a manner described in Comparative Example 1. Instead of being coated with an epoxy coating of the type used in Examples 2-6, each end of a first set of rods was coated with a commercially available, electroconductive silver paint (Example 7), and each end of a second set of rods was coated with gold using a vapor deposition process (Example 8). The rods were dipped in 70 wt % nitric acid for 15 seconds and their resistance was measured when a voltage of 1V DC was applied. The measured resistance was low in both cases. The silver paint was easily removed by hard surface contact. The gold coating was removed by mechanical manipulation.

TABLE 1

Coating Composition and Component Resistance

| | Example 2 Parts | Example 3 Parts | Example 4 Parts | Example 5 Parts | Example 6 Parts | Example 7 | Example 8 | Comp. Example 2 |
|---|---|---|---|---|---|---|---|---|
| Components of Coating | | | | | | | | |
| Epon 862 portion of Zyvex(a) | 9.8 | 2.45 | 2.45 | 2.45 | 2.45 | | | NONE |
| MWCNT portion of Zyvex(a) | 0.2 | 0.05 | 0.05 | 0.05 | 0.05 | | | NONE |
| MWCNT(b) | | 0.5 | 0.5 | | 1 | | | NONE |
| Lindax-1 | 0.3 | 0.075 | 0.075 | 0.075 | 0.075 | | | NONE |
| Ag Nano(c) | | | 0.5 | 0.5 | 0.8 | | | NONE |
| Toluene(d) | | | | | 1.3 | | | NONE |
| Paint | | | | | | Silver | | NONE |
| Vapor Depos. of Metal | | | | | | | Gold | NONE |
| Resistance Meas. | | | | | | | | |
| Bulk surface R/cm of coating material with no applied voltage | 60 Kohm/cm | 52 Kohm/cm | 15.6 Kohm/cm | 60 Kohm/cm | 300 ohm/cm | 0.001 ohm/cm | 0.001 ohm/cm | |

TABLE 1-continued

Coating Composition and Component Resistance

| | Example 2 Parts | Example 3 Parts | Example 4 Parts | Example 5 Parts | Example 6 Parts | Example 7 | Example 8 | Comp. Example 2 |
|---|---|---|---|---|---|---|---|---|
| Bulk surface R/cm with applied voltage of 1 V DC | 964 ohm/cm | 479 ohm/cm | 413 ohm/cm | 545 ohm/cm | 313 ohm/cm | 280 ohm/cm | 342 ohm/cm | 800 ohm/cm |
| Coating Adhes. Rating | 3 | 3 | 3 | 3 | 3 | 1 | 2 | — |

(a)The Zyvex (www.zyvexpro.com) contained 98 wt % Epon 862 and 2 wt % Functionalized MWCNT (data provided by vendor)
(b)Unfunctionalized CNT, Sigma-Aldrich Product No. 694185 (Sigma Aldrich, St. Louis, MO)
(c)Ag nanoparticles of 40 nm average size with 8-100 nm primary particle size range, random dimensions
(d)Components were pre-blended in toluene Example 9

The procedure of Example 2 was repeated with the exception that the filler used in the coating was a palladium nanopowder with ellipsoidal to spherical particles having a size range of about 4 to about 58 nm. The coating on the components was found to have an adhesion rating of 3.

Example 10

The procedure of Example 2 was repeated with the exception that the filler used in the coating was a 50/50 wt % blend of MWCNT and a palladium nanopowder having an ellipsoidal to spherical particles with a size range of about 4 to about 58 nm. The coating on the components was found to have an adhesion rating of 3.

Prophetic Example 11

The procedure of Example 2 is repeated with the exception that the filler used in the coating is a diamond nanopowder, which provides enhanced scratch resistance in plastics. The components are expected to have an adhesion rating of 3.

Prophetic Example 12

The procedure of Example 1 is repeated with the exception that the resin used in the substrate and the coating is a thermosetting polyester and an organic peroxide. The components are expected to have an adhesion rating of 3.

Prophetic Example 13

The procedure of Example 2 is repeated with the exception that the resin used in the substrate and the coating is a thermoplastic polybutylphthalates resin and thus no crosslinking agent is required. The components are expected to have an adhesion rating of 3.

Prophetic Example 14

The procedure of Example 2 is repeated with the exception that the resin used in the substrate and the coating is an elastomeric fluoropolymer and a solvent. A suitable fluoroelastomer polymer in gum polymer form, such as DuPont Viton® A-100, is combined with a crosslinking agent, such as DuPont Viton® Curative #50. The components are expected to have an adhesion rating of 3.

It will be appreciated that the above-disclosed and other features and functions, or alternatives thereof, may be desirably combined into many other different systems or applications. Various presently unforeseen or unanticipated alternatives, modifications, variations, or improvements therein may be subsequently made by those skilled in the art, which are also intended to be encompassed by the following claims. Unless specifically defined in a specific claim itself, steps or components of the invention should not be implied or imported from any above example as limitations to any particular order, number, position, size, shape, angle, color, or material.

What is claimed is:

1. An electrical component comprising:
   an electrical contact comprising:
      a rod-shaped substrate comprising a plurality of electroconductive filler fibers in a polymeric binder, the fibers being present in an amount of 25 to 99 parts by weight based upon 100 parts by weight of fibers and binder, the substrate having a first end portion having a first length and comprising a tip portion with a surface, and a second end portion having a second length and being longitudinally spaced from the first end portion, and
      a coating layer having a thickness of no more than 3 mm, the coating layer being formed only on the surface of the tip portion, and comprising a nanostructured electroconductive particulate filler and a polymeric resin.

2. The component of claim 1, wherein the nanostructured electroconductive particulate filler is uniformly dispersed in the resin.

3. The component of claim 2, wherein the polymeric binder and the polymeric resin comprise the same polymer.

4. The component of claim 1, wherein the nanostructured electroconductive particulate filler comprises at least one member selected from the group consisting of carbon nanotubes, boron nitride nanotubes, metal nanoparticles, metal oxides, organic salts, inorganic salts, and crushed fibers.

5. The component of claim 4, wherein the coating includes a secondary filler comprising at least one member selected from the group consisting of a strengthener, a scratch preventer, a surface friction reducer, a hardness controlling additive, a contamination preventer, a corrosion preventer, or a coloring agent.

6. The component of claim 4, wherein the resin comprises at least one member selected from the group consisting of epoxies, acetals, ionic and non-ionic polyurethanes, polyimides, polyesters, silicones, ionic and non-ionic synthetic rubbers, ionic and non-ionic natural rubbers, polyether sulfones, polysulphones, polybutylphthalates, polyether ether ketones, polyether imides, polystyrenes, polyolefins, polyethylene terephthalates (PETs), polyamides, polyvinyl chlorides, polyphenylene oxides, polycarbonates, ABS, fluoropolymers, and blends and copolymers thereof.

7. The component of claim 6, wherein the electroconductive filler fiber in the substrate comprises aligned carbon fibers, and the polymeric binder in the substrate comprises at least one member selected from the group consisting of epoxies, acetals, polyesters, rubbers, polyurethanes, polyether sulfones, polysulphones, polybutylphthalates, polyether ether ketones, polyether imides, polystyrenes, polyethylene terephthalates, polyamides, polyimides, polyvinylchlorides, polyphenylene oxides, polycarbonates, acrylonitrile-butadiene-styrene terpolymers, silicones, fluoropolymers, and polyolefins.

8. The component of claim 1, wherein the polymeric binder and the polymeric resin comprise epoxy.

9. The component of claim 1, wherein the coating layer contains at least 0.5 wt % nanostructured electroconductive particulate filler.

10. The component of claim 1, wherein the resin comprises at least one member selected from the group consisting of epoxies, acetals, ionic and non-ionic polyurethanes, polyimides, polyesters, silicones, ionic and non-ionic synthetic rubbers, ionic and non-ionic natural rubbers, polyether sulfones, polysulphones, polybutylphthalates, polyether ether ketones, polyether imides, polystyrenes, polyolefins, polyethylene terephthalates (PETs), polyamides, polyvinyl chlorides, polyphenylene oxides, polycarbonates, ABS, fluoropolymers, and blends and copolymers thereof.

11. The component of claim 1, wherein the substrate contains about 80 to about 98 parts by weight electroconductive filler fiber based upon 100 parts by weight of the polymeric binder and the electroconductive filler fiber.

12. The component of claim 1, wherein the electroconductive filler fiber in the substrate comprises aligned fibers.

13. The component of claim 1, wherein the electroconductive filler fiber in the substrate comprises aligned carbon fibers.

14. The component of claim 1, wherein the polymeric binder in the substrate comprises at least one member selected from the group consisting of epoxies, acetals, polyesters, rubbers, polyurethanes, polyether sulfones, polysulphones, polybutylphthalates, polyether ether ketones, polyether imides, polystyrenes, polyethylene terephthalates, polyamides, polyimides, polyvinylchlorides, polyphenylene oxides, polycarbonates, acrylonitrile-butadiene-styrene terpolymers, silicones, fluoropolymers, and polyolefins.

15. The component of claim 1, further comprising a sleeve layer formed over the second end portion of the substrate.

16. The component of claim 1, wherein the coating layer has a thickness of no more than 2 mm.

17. The component of claim 16, wherein the nanostructured electroconductive particulate filler comprises carbon nanotubes.

18. The component of claim 1, wherein the component interconnects a sensor and a test device.

19. The component of claim 1, wherein the polymeric binder and the polymeric resin comprise the same polymer.

20. The electrical component of claim 1, wherein the surface resistance of the coating layer is the same as the bulk resistance of the substrate.

21. The component of claim 1, wherein the electrical contact comprises an instrument probe.

22. The component of claim 1, wherein the component is part of a set of 10-100 probes arranged in an array, and each probe has an electrical resistance within 1% of the resistance of each of the other probes in the set.

23. The component of claim 1, wherein the coating layer contains about 2 to about 20 wt. % nanostructured electroconductive particulate filler.

* * * * *